United States Patent
Nakagawa et al.

(10) Patent No.: US 7,329,478 B2
(45) Date of Patent: Feb. 12, 2008

(54) CHEMICAL AMPLIFIED POSITIVE PHOTO RESIST COMPOSITION AND METHOD FOR FORMING RESIST PATTERN

(75) Inventors: Yusuke Nakagawa, Kawasaki (JP); Shinichi Hidesaka, Kawasaki (JP); Kenji Maruyama, Kawasaki (JP); Satoshi Shimatani, Kawasaki (JP); Masahiro Masujima, Kawaski (JP); Kazuyuki Nitta, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 10/528,617

(22) PCT Filed: May 20, 2004

(86) PCT No.: PCT/JP2004/007206
§ 371 (c)(1),
(2), (4) Date: Mar. 21, 2005

(87) PCT Pub. No.: WO2004/104703
PCT Pub. Date: Dec. 2, 2004

(65) Prior Publication Data
US 2006/0003260 A1    Jan. 5, 2006

(30) Foreign Application Priority Data
May 22, 2003 (JP) .............................. 2003-144700
Dec. 24, 2003 (JP) .............................. 2003-426503

(51) Int. Cl.
  G03F 7/004 (2006.01)
  G03F 7/30 (2006.01)
(52) U.S. Cl. ................ 430/288.1; 430/170; 430/270.1; 430/326; 430/330; 430/905
(58) Field of Classification Search ............ 430/288.1, 430/270.1, 170, 905, 326, 330
See application file for complete search history.

(56) References Cited

U.S. PATENT DOCUMENTS 5,658,708 A * 8/1997 Kondo .................... 430/288.1
5,876,900 A * 3/1999 Watanabe et al. ........ 430/288.1
5,942,367 A   8/1999 Watanabe et al.
6,004,724 A  12/1999 Yamato et al.
6,072,006 A   6/2000 Bantu et al.
6,114,462 A   9/2000 Watanabe et al.
6,136,504 A * 10/2000 Tan et al. ................ 430/270.1
6,156,477 A * 12/2000 Motomi et al. .......... 430/270.1
6,262,181 B1  7/2001 Bantu et al.
6,485,895 B1 11/2002 Choi et al.
6,511,785 B1  1/2003 Takemura et al.
6,673,512 B1  1/2004 Uenishi et al.
6,787,290 B2 * 9/2004 Nitta et al. ............... 430/288.1

FOREIGN PATENT DOCUMENTS

| | | |
|---|---|---|
| JP | 58-194834 | 11/1983 |
| JP | 04-211258 | 8/1992 |
| JP | 06-148889 | 5/1994 |
| JP | 06-230574 | 8/1994 |
| JP | 06-289614 | 10/1994 |
| JP | 07-134412 | 5/1995 |
| JP | 09-006001 | 1/1997 |
| JP | 10-204125 | 8/1998 |
| JP | 10-268508 | 10/1998 |
| JP | 2000-356850 | 12/2000 |
| JP | 2001-142199 | 5/2001 |
| JP | 2002-529552 | 9/2002 |
| JP | 2003-050460 | 2/2003 |
| JP | 2003-167357 | 6/2003 |
| KR | 2001-88321 | 9/2001 |

* cited by examiner

Primary Examiner—John S. Chu
(74) Attorney, Agent, or Firm—Knobbe, Martens, Olson & Bear LLP

(57) ABSTRACT

To provide a chemical amplification type positive photoresist composition, which has high sensitivity, high heat resistance and high resolution (high contrast) and is capable of suppressing an undulation phenomenon, and a method for formation of a resist pattern, a chemical amplification type positive photoresist composition comprising (A) an alkali soluble resin comprising a hydroxystyrene constituent unit (a1) and a styrene constituent unit (a2), (B) a crosslinking agent, (C) a photo acid generator, and an organic solvent is prepared and a resist pattern is formed by using the same.

13 Claims, No Drawings

CHEMICAL AMPLIFIED POSITIVE PHOTO RESIST COMPOSITION AND METHOD FOR FORMING RESIST PATTERN

This application is the U.S. National Phase under 35 U.S.C. §371 of International Application PCT/JP2004/007206, filed on May 20, 2004, which claims priority of Japanese Patent Application Nos. 2003-144700 and 2003-426503, filed on May 22, 2003 and Dec. 24, 2003 respectively. The International Application was published under PCT Article 21(2) in a language other than English.

TECHNICAL FIELD

The present invention relates to a chemical amplification type positive photoresist composition, and relates to a resist pattern forming method.

This application claims priority from Japanese Patent Application No. 2003-144700 filed on May 22, 2003, and Japanese Patent Application No. 2003-426503 filed on Dec. 24, 2003, the disclosure of which is incorporated by reference herein.

BACKGROUND ART

In the case of a conventional novolak-naphthoquinonediazide resist, a method of using a high-molecular weight alkali soluble resin (for example, novolak resin) has commonly been employed so as to prepare a resist composition having high heat resistance. Also, a method of using a low-molecular weight resin has been employed so as to achieve high sensitivity.

However, it is difficult to reconcile sensitivity and heat resistance. When using the high-molecular weight resin, sensitivity tends to deteriorate and it was difficult to apply the resulting composition to a resist for TFT (thin film transistor) to which high sensitivity is required.

In the fields of a thick-film resist having a thickness of about 1.5 to 7.0 μm and system LCD (liquid crystal display) using low-temperature polysilicone as a substrate, heat resistance is severely required in the implantation step, and thus there is required a resist material which has excellent heat resistance without deteriorating sensitivity (rather high sensitivity).

On the other hand, there is proposed a chemical amplification type positive photoresist composition comprising an alkali soluble resin having a hydroxyl group in the side chain of a novolak resin, a specific crosslinking agent and a photo acid generator (PAG) (see, for example, Patent Documents 1 and 2).

Since this chemical amplification type positive photoresist composition is a resist which is lower in price than a conventional i-ray novolak resist and also has high heat resistance, high sensitivity and high resolution, its application to the fields of a thick-film resist (for example, 1.5 to 7.0 μm) in which high heat resistance and high sensitivity are required, and system LCD can be anticipated.

(Patent Document 1) Japanese Patent Application, First Publication No. Hei 6-148889
(Patent Document 2) Japanese Patent Application, First Publication No. Hei 6-230574

Recently, integration degree of semiconductor devices has increased more and more.

Various proposals have hitherto been made on a chemical amplification type resist which contributes to an improvement in integration degree of semiconductor devices.

In the following Patent Document 3, there is described a two-component resist comprising a base material resin wherein hydrogen of hydroxyl groups of polyhydroxystyrene having high transparency to KrF excimer laser beam is substituted with an acid dissociable alkali dissolution inhibiting group, for example, tertiary alkyloxycarbonyl group such as t-boc (tert-butoxycarbonyl) group or acetal group such as 1-ethoxyethyl group, and a photo acid generator as a main component.

A summary of principle of resist pattern formation in the resist proposed in Patent Document 3 is as follows. That is, since the base material resin has an alkali dissolution inhibiting group such as a t-boc group, alkali solubility is inferior to polyhydroxystyrene having no t-boc group. When such a resin is mixed with a photo acid generator and the mixture is selectively exposed, the t-boc group is dissociated by an action of an acid generated from a photo acid generator at the exposed area to produce polyhydroxystyrene, and thus the resin becomes alkali soluble.

(Patent Document 3) Japanese Patent Application, First Publication No. Hei 4-211258
(Patent Document 4) Japanese Patent Application, First Publication No. Hei 10-268508
(Patent Document 5) Japanese Patent Application, First Publication No. 2003-167357

DISCLOSURE OF THE INVENTION

However, in the case of the resist compositions described in Patent Documents 1 and 2, when a linear resist pattern (line pattern) is formed, an undulation phenomenon tends to be seen when observed from right over the line pattern, and thus improvement is required.

Under these circumstances, a first object of the present invention is to provide a chemical amplification type positive photoresist composition, which has high sensitivity, high heat resistance and high resolution (high contrast) and is capable of suppressing the undulation phenomenon, and a method for formation of a resist pattern.

According to the technique described in Patent Document 3, regarding alkali solubility of a base material resin upon selective exposure, original alkali solubility of polyhydroxystyrene is recovered by dissociation of a t-boc group due to exposure, and improved alkali solubility cannot be achieved. Therefore, it is insufficient in resolution. The use of an alkali dissolution inhibiting group is likely to cause defects in the case of alkali development.

In Patent Document 4, there is proposed a resist material made of a resin prepared by preliminarily crosslinking a resin comprising a hydroxystyrene unit and a cyclohexanol unit with an ether group. However, the resist material is insufficient because a problem such as defects arises.

Defects means scum and general defects of a resist pattern, which are detected when observed from right over the developed resist pattern, using a surface defect detection equipment (trade name: "KLA") manufactured by KLA-TENCOR CORPORATION.

In Patent Document 5, there is proposed a photoresist composition comprising a resin wherein a portion of hydrogen atoms of hydroxyl groups of hydroxystyrene is protected with an alkali dissolution inhibiting group such as an acetal group, a photo acid generator and a crosslinking polyvinyl ether compound, and the resin and the polyvinyl ether compound are crosslinked by prebaking (PB: prebake) and patterning is conducted by subjecting to exposure, PEB (post exposure bake) and development. Since the alkali dissolution inhibiting group is introduced into the resin, the resist composition is insufficient because a problem such as defects arises.

Thus, the second object of the present invention is to provide a positive resist composition and resist pattern forming method, which can improve resolution and reduce defects.

The present inventors have intensively studied and found the following means for achieving the above first object, and thus the first aspect of the present invention has been completed.

That is, the chemical amplification type positive photoresist composition according to the first aspect of the present invention comprises (A) an alkali soluble resin comprising a constituent unit (a1) represented by the following general formula (I):

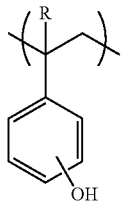

(I)

wherein R represents a hydrogen atom or a methyl group, and a constituent unit (a2) represented by the following general formula (II):

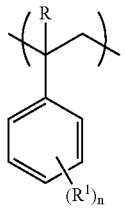

(II)

wherein R represents a hydrogen atom or a methyl group, $R^1$ represents an alkyl group having 1 to 5 carbon atoms and n represents an integer of 0 or 1 to 3; (B) a compound represented by the following general formula (III):

$$H_2C=CH-O-R^2-O-CH=CH_2$$ (III)

wherein $R^2$ represents either an alkylene group having 1 to 10 carbon atoms which may have a substituent, or a group represented by the following general formula (IV):

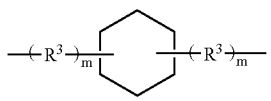

(IV)

(wherein $R^3$ represents an alkylene group having 1 to 10 carbon atoms which may have a substituent, and m represents 0 or 1), and the alkylene group may have an oxygen bond (ether bond) in the main chain; (C) a compound generating an acid component under irradiation with radiation; and an organic solvent.

In the chemical amplification type positive photoresist composition, the component (A) preferably comprises the constituent unit (a1) and the constituent unit (a2).

The content of the constituent unit (a2) in the component (A) is preferably from 1 to 20 mol %.

The component (C) is preferably a compound generating an acid component under irradiation with i-rays (365 nm).

Preferably, the chemical amplification type positive photoresist composition further comprises a basic compound (D).

The method for formation of a resist pattern according to the first aspect of the present invention comprises the steps of (i) applying the positive photoresist composition of the present aspect on a substrate and subjecting to a heat treatment to form a resist layer having a film thickness of 1.5 to 7.0 μm; (ii) performing selective exposure; (iii) performing PEB (post exposure bake); and (iv) performing a development treatment with an aqueous alkali solution to form a resist pattern.

As used herein, the term "constituent unit" means a repeating unit in a polymer (a unit derived from a monomer as a raw material of the polymer).

To achieve the second object, the following composition was employed in the second aspect of the present invention.

The chemical amplification type positive photoresist composition of the second aspect is a chemical amplification type positive photoresist composition (hereinafter sometimes referred to as a "three-component chemical amplification type positive photoresist composition") comprising (A') an alkali soluble resin, (B') a photo acid generator generating an acid under irradiation with radiation, and (C') a crosslinking polyvinyl ether compound, wherein the component (A') comprises a unit (a1') derived from (α-methyl)hydroxystyrene represented by the following general formula (I'):

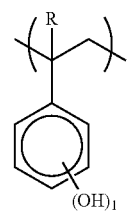

(I')

wherein R represents a hydrogen atom or a methyl group and l represents an integer of 1 to 3, and an alkali-insoluble unit (a2') having no acid dissociable dissolution inhibiting group, and wherein a dissolution rate to an aqueous 2.38 wt % TMAH (tetramethylammonium hydroxide) solution of the component (A') is from 10 to 100 nm/second.

The method for formation of a resist pattern of the second aspect comprises applying the positive photoresist composition on a substrate, and subjecting it to prebake, selective exposure, PEB (post exposure bake) and alkali development to form a resist pattern.

In the first aspect of the present invention, there can be provided a chemical amplification type positive photoresist composition, which has high sensitivity, high heat resistance and high resolution (high contrast) and is capable of suppressing an undulation phenomenon, and a method for formation of a resist pattern, In the second aspect of the present invention, an improvement in resolution and reduction of defects can be realized.

BEST MODE FOR CARRYING OUT THE INVENTION

First Aspect

Chemical Amplification Type Positive Photoresist Composition

The chemical amplification type positive photoresist composition according to the first aspect of the present invention comprises (A) an alkali soluble resin comprising a constituent unit (a1) represented by the general formula (I) and a constituent unit (a2) represented by the general formula (II), (B) a compound represented by the general formula (III), (C) a compound generating an acid component under irradiation with radiation, and an organic solvent.

Component (A)

Constituent Unit (a1)

In the constituent unit (a1) represented by the general formula (I), R is a hydrogen atom or a methyl group, and preferably a hydrogen atom.

The hydroxyl group may be substituted on any of the o-, m- and p-position, and preferably the p-position in view of availability and low cost.

The content of the constituent unit (a1) in the component (A) is from 50 to 99 mol %, and preferably from 70 to 90 mol %. When the content is 99 mol % or less, it becomes possible to prevent a disadvantage in which the effects of the present invention can not be obtained because the content of the constituent unit (a2) is too small. When the content is 50 mol % or more, it becomes possible to easily control solubility in an aqueous alkali solution.

Constituent Unit (a2)

In the constituent unit (a2) represented by the general formula (II), R is a hydrogen atom or a methyl group, and preferably a hydrogen atom.

$R^1$ is a linear or branched alkyl group having 1 to 5 carbon atoms, and examples thereof include methyl group, ethyl group, propyl group, isopropyl group, n-butyl group, isobutyl group, tert-butyl group, pentyl group, isopentyl group and neopentyl group. Among these groups, a methyl group or an ethyl group is preferable from an industrial point of view.

n is an integer of 0 or 1 to 3. n is preferably 0 or 1, and particularly preferably 0 from an industrial point of view.

When n is 1 to 3, $R^1$ may be substituted on any of the o-, m- and p-positions. When n is 2 or 3, any substitution positions can be combined.

The content of constituent unit (a2) in the component (A) is from 1 to 30 mol %, and preferably from 5 to 15 mol %. When the content is 1 mol % or more, the effects of this aspect can be improved. Furthermore, depth of focus (DOF) and linearity (characteristics capable of reproducing a resist pattern corresponding to different mask sizes on a reticle with good accuracy when exposed under the same exposure conditions (exposure dose is the same, although mask sizes on the reticle are different)) are also improved.

When the content is 30 mol % or less, it is made possible to easily control solubility in an aqueous alkali solution in view of balance with the constituent unit (a1).

The component (A) may comprise a constituent unit other than the constituent units (a1) and (a2).

The other constituent unit, which is copolymerizable with the constituent units (a1) and (a2), is not specifically limited as long as it is used in the resist composition and includes, for example, a constituent unit derived from acrylic acid or methacrylic acid.

In view of the effects, the total content of the constituent units (a1) and (a2) in the component (A) is preferably 80 mol % or more, and more preferably 90 mol % or more (most preferably 100 mol %).

When the component (A) is composed only of the constituent units (a1) and (a2), a mixing ratio of the constituent unit (a1) to the constituent unit (a2) is preferably from 99:1 to 80:20 (molar ratio), and particularly preferably from 95:5 to 85:15 (molar ratio).

As the component (A), one or more kinds of materials can be used.

The weight-average molecular weight (weight-average molecular weight as measured by gel permeation chromatography (GPC) using polystyrene standards) of the component (A) is preferably from 1000 to 20000, and particularly preferably from 2000 to 5000.

The alkali soluble resin can be mixed with a component other than the component (A), and the alkali soluble resin is preferably composed only of the component (A). The alkali soluble resin other than the component (A) is not specifically limited as long as it can be used in the resist composition and includes, for example, a novolak resin.

In the chemical amplification type positive photoresist composition of the present invention, the amount of the component (A) is not specifically limited as long as sufficient concentration or viscosity to impart coatability can be obtained.

Component (B)

The component (B) is a crosslinking agent.

Therefore, in the step (i), when the chemical amplification type positive photoresist composition is applied on a substrate and then heated, hydroxyl groups in the side chain of the component (A) react with a vinyl group of the component (B) to form a crosslinked structure. Consequently, the chemical amplification type positive photoresist composition becomes slightly soluble in the aqueous alkali solution.

In the step (iii), when exposed to generate an acid component from the component (C) at the exposed area, the crosslinked structure is cleaved by an action of the acid component and thus the chemical amplification type positive photoresist composition becomes soluble in the aqueous alkali solution.

Regarding a ratio of the component (A) to the component (B), in view of imparting such characteristics that the composition becomes slightly soluble in an aqueous alkali solution and becomes soluble due to the action of the acid component, the content of the component (B) is adjusted within a range from 1 to 30 parts by weight, and preferably from 1 to 20 parts by weight, based on 100 parts by weight of the component (B).

In the general formula (III), $R^2$ is a branched or linear alkylene group having 1 to 10 carbon atoms which may have a substituent, or a substituent represented by the general formula (IV). The alkylene group may have an oxygen bond (ether bond) in the main chain. In the general formula (IV), $R^3$ is also a branched or linear alkylene group having 1 to 10 carbon atoms which may have a substituent, and the alkylene group may have an oxygen bond (ether bond) in the main chain. $R^2$ is preferably —$C_4H_8$—, —$C_2H_4OC_2H_4$—, —$C_2H_4OC_2H_4OC_2H_4$—, or a substituent represented by the general formula (IV), and is more preferably a substituent represented by the general formula (IV). It is particularly preferable that $R^3$ have one carbon atom and that m be 1 in the general formula (IV).

As the component (B), one or more kinds can be used in combination.

Component (C)

Since the components (A) and (B) are crosslinked by heat upon prebaking to form an alkali-insolubilized resist layer over the entire surface of the substrate, the component (C) has a function of generating an acid under exposure at the exposed area, cleaving the crosslinking with the acid, and making the insolubilized resist layer be soluble in alkali.

The compound generating an acid under irradiation with radiation, which has the above function, is a so-called photo acid generator used in the chemical amplification type resist. Various compounds have hitherto been proposed and the photo acid generator may be optionally selected from these compounds.

In the production of LCDs, ultraviolet light in which g-rays, h-rays and i-rays coexist is used. The component is preferably a compound with high acid generation efficiency when irradiated with ultraviolet light. Since i-rays having a short wavelength are used so as to improve resolution, a compound with high acid generation efficiency to i-ray exposure is preferable.

Because of high acid generation efficiency to i-ray exposure, the following compounds are preferably used as the component (C).

Compounds represented by the following formulas:

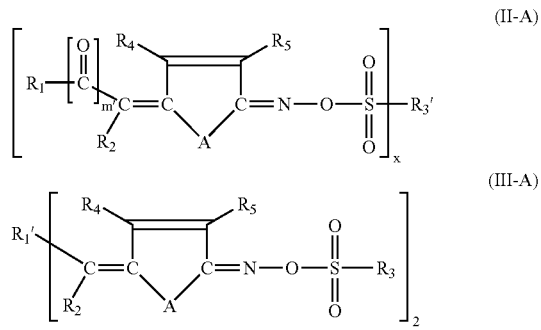

wherein m' represents 0 or 1; X represents 1 or 2; $R_1$ represents a phenyl group which may be substituted with one or more alkyl groups having 1 to 12 carbon atoms, a heteroaryl group, or an alkoxycarbonyl group having 2 to 6 carbon atoms, a phenoxycarbonyl group or CN when m' is 0; $R_1'$ represents an alkylene group having 2 to 12 carbon atoms; $R_2$ represents a phenyl group which may be substituted with one or more alkyl groups having 1 to 12 carbon atoms, a heteroaryl group, or an alkoxycarbonyl group having 2 to 6 carbon atoms, phenoxycarbonyl group or CN when m' is 0; $R_3$ represents an alkyl group having 1 to 18 carbon atoms; $R_3'$ represents an alkyl group having 1 to 18 carbon atoms when X=1, or an alkylene group having 2 to 12 carbon atoms or a phenylene group when X=2; $R_4$ and $R_5$ each independently represents a hydrogen atom, halogen, or an alkyl group having 1 to 6 carbon atoms; A represents S, O or $NR_6$; and $R_6$ represents a hydrogen atom or a phenyl group (U.S. Pat. No. 6,004,724). Specific examples thereof include thiolene-containing oxime sulfonate represented by the following formula:

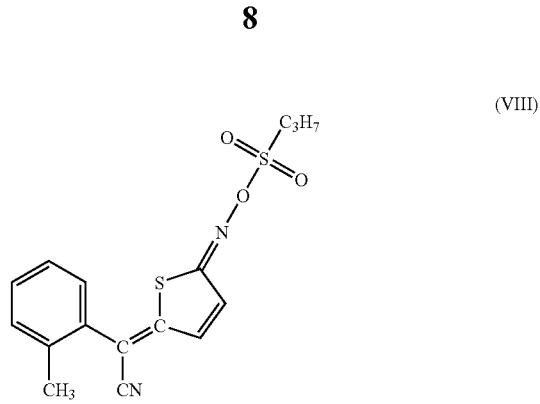

There is also exemplified a bis(trichloromethyl)triazine compound represented by the following formula (IV-A):

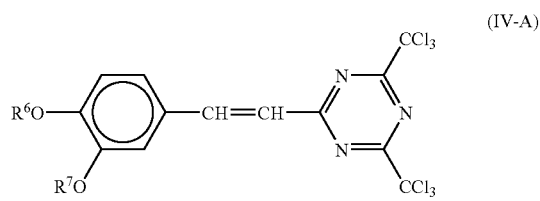

wherein $R^6$ and $R^7$ each represents an alkyl group having 1 to 3 carbon atoms, or a combination of the compound (IV-A) and a bis(trichloromethyl)triazine compound represented by the following formula (V-A):

wherein Z represents a 4-alkoxyphenyl group (Japanese Patent Application, First Publication No. Hei 6-289614 and Japanese Patent Application, First Publication No. Hei 7-134412).

Specific examples of the triazine compound (IV-A) include 2-[2-(3,4-dimethoxyphenyl)ethenyl]-4,6-bis (trichloromethyl)-1,3,5-triazine, 2-[2-(3-methoxy-4-ethoxyphenyl)ethenyl]-4,6-bis(trichloromethyl)-1,3,5-triazine, 2-[2-(3-methoxy-4-propoxyphenyl)ethenyl]-4,6-bis(trichloromethyl)-1,3,5-triazine, 2-[2-(3-ethoxy-4-methoxyphenyl) ethenyl]-4,6-bis(trichloromethyl)-1,3,5-triazine, 2-[2-(3,4-diethoxyphenyl)ethenyl]-4,6-bis(trichloromethyl)-1,3,5-triazine, 2-[2-(3-ethoxy-4-propoxyphenyl)ethenyl]-4,6-bis (trichloromethyl)-1,3,5-triazine, 2-[2-(3-propoxy-4-methoxyphenyl)ethenyl]-4,6-bis(trichloromethyl)-1,3,5-triazine, 2-[2-(3-propoxy-4-ethoxyphenyl)ethenyl]-4,6-bis (trichloromethyl)-1,3,5-triazine and 2-[2-(3,4-dipropoxyphenyl)ethenyl]-4,6-bis(trichloromethyl)-1,3,5-triazine. These triazine compounds may be used alone or in combination.

Examples of the triazine compound (V-A), which is optionally used in combination with the triazine compound (IV-A), include 2-(4-methoxyphenyl)-4,6-bis(trichloromethyl)-1,3,5-triazine, 2-(4-ethoxyphenyl)-4,6-bis(trichloromethyl)-1,3,5-triazine, 2-(4-propoxyphenyl)-4,6-bis(trichloromethyl)-1,3,5-triazine, 2-(4-butoxyphenyl)-4,6-bis(trichloromethyl)-1,3,5-triazine, 2-(4-methoxynaphthyl)-4,6-bis(trichloromethyl)-1,3,5-triazine, 2-(4-ethoxynaphthyl)-4,6-bis(trichloromethyl)-1,3,5-triazine, 2-(4-propoxynaphthyl)-4,6-bis(trichloromethyl)-1,3,5-triazine, 2-(4-butoxynaphthyl)-4,6-bis(trichloromethyl)-1,3,5-triazine, 2-(4-methoxy-6-carboxynaphthyl)-4,6-bis(trichloromethyl)-1,3,5-triazine, 2-(4-methoxy-6-hydroxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(5-ethyl-2-furyl)ethenyl]-4,6-bis(trichloromethyl)-1,3,5-triazine, 2-[2-(5-propyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3-methoxy-5-ethoxyphenyl)ethenyl]-4,6-bis(trichloromethyl)-1,3,5-triazine, 2-[2-(3-methoxy-5-propoxyphenyl)ethenyl]-4,6-bis(trichloromethyl)-1,3,5-triazine, 2-[2-(3-ethoxy-5-methoxyphenyl)ethenyl]-4,6-bis(trichloromethyl)-1,3,5-triazine, 2-[2-(3,5-diethoxyphenyl)ethenyl]-4,6-bis(trichloromethyl)-1,3,5-triazine, 2-[2-(3-ethoxy-5-propoxyphenyl)ethenyl]-4,6-bis(trichloromethyl)-1,3,5-triazine, 2-[2-(3-propoxy-5-methoxyphenyl)ethenyl]-4,6-bis(trichloromethyl)-1,3,5-triazine, 2-[2-(3-propoxy-5-ethoxyphenyl)ethenyl]-4,6-bis(trichloromethyl)-1,3,5-triazine, 2-[2-(3,5-dipropoxyphenyl)ethenyl]-4,6-bis(trichloromethyl)-1,3,5-triazine, 2-(3,4-methylenedioxyphenyl)-4,6-bis(trichloromethyl)-1,3,5-triazine and 2-[2-(3,4-methylenedioxyphenyl)ethenyl]-4,6-bis(trichloromethyl)-1,3,5-triazine. These triazine compounds may be used alone or in combination.

There is also exemplified a compound represented by the following formula (VI-A):

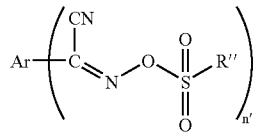

(VI-A)

in the formula (VI-A), Ar represents a substituted or unsubstituted phenyl group or a naphthyl group; R″ represents an alkyl group having 1 to 9 carbon atoms; and n′ represents an integer of 2 or 3. These compounds may be used alone or in combination. Among these compounds, a compound represented by the formula (VIII) and a compound represented by the following formula (VII-A) are preferably used because they are excellent in acid generation efficiency to i-rays.

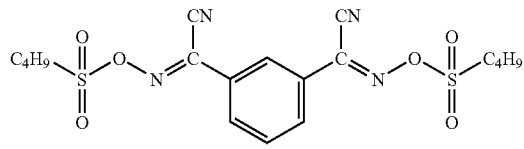

(VII-A)

The amount of the component (C) is preferably from 1 to 30 parts by weight, and preferably from 1 to 20 parts by weight, based on 100 parts by weight of the component (A).

Component (D)

The chemical amplification type positive photoresist composition of the present invention preferably contains a basic compound (preferably amines) as the component (D) so as to enhance post exposure stability of the latent image formed by the patternwise exposure of the resist layer.

The compound is not specifically limited as long as it has compatibility with the resist composition and examples thereof include a compound described in Japanese Patent Application, First Publication No. Hei 9-6001. The disclosure of Japanese Patent Application, First Publication No. Hei 9-6001 is incorporated by reference herein.

Among these, tertiary amine is preferable, and comparatively bulky amines (d1) such as tri-n-pentylamine, methyl-di-n-octylamine, tri-n-decylamine, tribenzylamine and N,N-dicyclohexylmethylamine are particularly preferable because they have not only the effect of enhancing the post exposure stability of the latent image formed by the patternwise exposure of the resist layer, but also the effect of suppressing production of an acid over time in the resist composition, thereby improving storage stability appropriate for the resist solution.

As the component (D), one or more kinds can be used in combination.

The content of the component (D) is preferably from 0.01 to 5.0 parts by weight, and particularly preferably from 0.1 to 1.0 parts by weight, based on 100 parts by weight of the solid content of the resin in view of the effects.

Organic Solvent

The organic solvent is not specifically limited as long as it can be used in the chemical amplification type positive resist composition.

Examples thereof include ester solvents such as propylene glycol monoalkyl ether acetate (for example, propylene glycol monomethyl ether acetate (PGMEA)) and lactate ester (for example, ethyl lactate); and non-ester solvents, for example, ketones such as acetone, methyl ethyl ketone, cyclohexanone, methyl isoamyl ketone and 2-heptanone, polyhydric alcohols such as ethylene glycol, propylene glycol, diethylene glycol, or their derivatives such as monomethyl ether, monoethyl ether, monopropyl ether, monobutyl ether or monophenyl ether of polyhydric alcohols, and cyclic ethers such as dioxane.

The ester solvents are reaction products of the organic carboxylic acid and the alcohol and therefore contain an organic carboxylic acid such as free acid. Therefore, in the resist composition containing no component (d1) or the resist composition containing no storage stabilizer described hereinafter, non-ester solvents containing no free acid are preferably selected and ketones (ketone solvents) are particularly preferable. Among these, 2-heptanone is particularly preferable in view of coatability and solubility of the component (C).

Both ester and non-ester solvents are sometimes decomposed over time to produce an acid as a by-product; however, the decomposition reaction is suppressed in the presence of the component (d1) or the storage stabilizer described hereinafter. The ester solvents exert a remarkable effect and are preferable in the presence of the component (d1) and the storage stabilizer, and PGMEA is particularly preferable.

It has been confirmed that the acid component as a by-product produced from the decomposition is formic acid, acetic acid, or propionic acid in the case of 2-heptanone.

One or more organic solvents can be used alone or in combination.

The organic solvent is not specifically limited and is used so that the solid content of the resist composition falls within a range from 20 to 50% by weight, and preferably from 25 to 45% by weight, in view of coatability.

The chemical amplification type positive photoresist composition of the present invention preferably contains the following storage stabilizers, if necessary.

The storage stabilizer is not specifically limited as long as it has an action of suppressing the decomposition reaction of the solvent and examples thereof include antioxidants described in Japanese Patent Application, First Publication No. Sho 58-194834. The disclosure of Japanese Patent Application, First Publication No. Sho 58-194834 is incorporated by reference herein. As the antioxidant, a phenolic compound and an amine compound are known and the phenolic compound is preferable. Particularly, 2,6-di(tert-butyl)-p-cresol and derivatives thereof are preferable because they are effective against deterioration of the ester solvent and the ketone solvent and are commercially available, and are also inexpensive and excellent in storage stabilization effect. In particular, they are excellent in deterioration preventing effect to propylene glycol monoalkyl ether acetate and 2-heptanone.

The content of the storage stabilizer is preferably from 0.01 to 3 parts by weight, and particularly preferably from 0.1 to 1.0 parts by weight, based on 100 parts by weight of the solid content of the resin.

To the chemical amplification type positive photoresist composition of the present invention, there can be optionally added additives having compatibility, for example, additive resins, plasticizers, stabilizers and surfactants used for improving performances of the resist film; colorants used for further visualizing the developed images; sensitizers and antihalation dyes used for further improving the sensitization effect; and conventional additives such as adhesion improvers; as long as the objects of the present invention are not adversely affected.

Method for Formation of Resist Pattern

An example of a preferred method for formation of a resist pattern will now be described.

First, the positive photoresist composition of the present invention is applied on a substrate using a spinner to form a coating film. The substrate is preferably a silicon substrate or a glass substrate.

Then, the substrate comprising the coating film formed thereon is subjected to a heat treatment (prebaking) to remove the residual solvent, and thus a resist coating film is formed.

Furthermore, the resist coating film is selectively exposed using a mask (reticle) with a mask pattern.

As a light source, a light source for i-rays (365 nm), or a light source for light having a shorter wavelength is preferably used so as to form a fine pattern.

Then, the selectively exposed resist coating film is subjected to a heat treatment (post exposure bake: PEB).

When the resist coating film subjected to PEB is subjected to a development treatment with a developer solution, for example, aqueous alkali solutions such as aqueous 1-10 wt % tetramethylammonium hydroxide solution, the exposed area is dissolved and removed to form a resist pattern.

Furthermore, the developer solution remaining on the surface of the resist pattern is removed by washing with a rising liquid such as pure water to form a resist pattern.

The composition of this aspect is particularly excellent in heat resistance and is therefore suited for use in a thick-film process wherein a film thickness is from 1.5 to 7.0 μm.

The chemical amplification type positive photoresist composition of this aspect has high sensitivity, high heat resistance and high resolution (high contrast) and is also capable of suppressing the undulation phenomenon.

Also, the chemical amplification type positive photoresist composition is excellent in depth of focus and linearity.

Therefore, the chemical amplification type positive photoresist composition has good properties for various applications, as a matter of course, and is suited for used in the field of thick-film resist (for example, film thickness of 1.5 to 7.0 μm) to which high heat resistance and high sensitivity are required, and also the photoresist composition of this aspect is suited for use in the field of system LCDs because of excellent linearity.

Second Aspect

Chemical Amplification Type Positive Photoresist Composition

The chemical amplification type positive photoresist composition of the second aspect is a three-component chemical amplification type positive photoresist composition comprising (A') an alkali soluble resin, (B') a photo acid generator generating an acid under irradiation with radiation, and (C') a crosslinking polyvinyl ether compound, wherein the component (A') comprises a unit (a1') derived from (α-methyl)hydroxystyrene represented by the above general formula (I'), and an alkali-insoluble unit (a2') having no acid dissociable dissolution inhibiting group, and wherein a dissolution rate to an aqueous 2.38 wt % TMAH (tetramethylammonium hydroxide) solution of the component (A') is from 10 to 100 nm/second.

(A') Alkali Soluble Resin

Unit (a1') Derived from (α-methyl)hydroxystyrene

When having the constituent unit (a1') represented by the general formula (I'), the entire component (A') becomes alkali soluble and a crosslinking reaction product of the components (A') and (C') can be obtained by heating upon prebaking.

In the general formula (I'), R is a hydrogen atom or a methyl group, and preferably a hydrogen atom.

l is preferably 1 in view of industrial availability.

The hydroxyl group may be substituted on any of the o-, m- and p-positions. When l is 2 or 3, any substitution positions can be combined. When l is 1, a hydroxyl group may be substituted at any of the o-, m- and p-positions, and preferably the p-position in view of availability and inexpensive.

The term "(α-methyl)hydroxystyrene" means either or both of hydroxystyrene and α-methylhydroxystyrene. The term "constituent unit derived from (α-methyl)hydroxystyrene" means a constituent unit constituted by cleavage of ethylenical double bonds of (α-methyl)hydroxystyrene.

In the claims and the specification, the term "unit" or "constituent unit" means a monomer unit constituting a polymer.

The content of the constituent unit (a1') in the component (A') is preferably 60 mol % or more, more preferably from 70 to 90 mol %, and most preferably from 75 to 85 mol %, in view of control of solubility due to the reaction with the component (C') described hereinafter.

Alkali-Insoluble Unit (a2') Having No Acid Dissociable Dissolution Inhibiting Group In the constituent unit (a2'), the term "having no acid dissociable dissolution inhibiting group" means that a constituent unit wherein hydrogen atom of the hydroxyl group is substituted with an acid dissociable alkali dissolution inhibiting group such as t-boc (tert-butoxycarbonyl) group or ethoxyethyl group in a unit having a phenolic hydroxyl group, and a tertiary ester constituent unit as a (meth) acrylate unit ((meth)acrylate means either or both of acrylate and methacrylate) wherein an OH group of a carboxyl group of a constituent unit derived from (meth)acrylic acid is substituted with a tertiary alkyloxy group are excluded.

When the resist composition of this aspect comprises a constituent unit (a2') which is scarcely influenced by the acid component generated from the component (B') described hereinafter and is also alkali-insoluble (insoluble in an alkali developer solution), it becomes possible to prevent swelling of a resist pattern due to alkali development and to improve resolution of a fine pattern.

The constituent unit (a2') is not specifically limited as long as it has no acid dissociable dissolution inhibiting group and is alkali-insoluble, as described above, but is preferably a unit derived from (α-methyl)styrene represented by the following general formula (II'):

wherein R represents a hydrogen atom or a methyl group, $R^{11}$ represents an alkyl group having 1 to 5 carbon atoms and n represents an integer of 0 or 1 to 3, because of excellent dry etching resistance.

The term "(α-methyl)styrene" means either or both of styrene and α-methylstyrene. The term "constituent unit derived from (α-methyl)styrene" is apparent from the general formula (II') and means a constituent unit constituted by cleavage of ethylenical double bonds of (α-methyl)styrene.

In the formula (II'), $R^{11}$ is a linear or branched alkyl group having 1 to 5 carbon atoms and examples thereof include methyl group, ethyl group, propyl group, isopropyl group, n-butyl group, isobutyl group, tert-butyl group, pentyl group, isopentyl group and neopentyl group. Among these groups, a methyl group or an ethyl group is preferably from an industrial point of view.

n is an integer 0 or 1 to 3. Among these, n is preferably 0 or 1, and particularly preferably 0 from an industrial point of view.

When n is from 1 to 3, $R^3$ may be substituted on any of the o-, m- and p-positions. When n is 2 or 3, any substitution positions can be combined.

The content of the constituent unit (a2') in the component (A') is preferably from 5 to 35 mol %, more preferably 10 to 30 mol %, and most preferably from 15 to 25 mol %. When the content is more than the lower limit, it becomes possible to suppress a disadvantage such as reduction in film thickness of the unexposed area upon development and to improve resolution. It also becomes possible to prevent swelling of a resist pattern due to alkali development and to improve resolution of a fine pattern. Control of the content to the upper limit or less easily makes the resulting composition soluble in an organic solvent.

Dissolution Rate

A dissolution rate of the exposed component (A') to an aqueous 2.38% wt % solution of TMAH (tetramethylammonium hydroxide) is from 10 to 100 nm/second, and preferably from 20 to 80 nm/second.

When the exposed component (A') has a small dissolution rate such as 100 nm/second or less, resolution is improved. The reason is believed to be as follows. That is, as described hereinafter, the crosslinked structure formed between the components (C') and (A') is dissolved in an alkali developer solution as a result of cleavage by an action of an acid at the exposed area, while the unexposed area is not dissolved in the alkali developer solution, and thus contrast at the interface can be enhanced. Also, the effect of reducing defects can be exerted.

By adjusting the dissolution rate of the exposed component (A') to 10 nm/second or more, the exposed component (A') is dissolved in an organic solvent to obtain a resist.

The dissolution rate can be adjusted by varying the content of the constituent units (a1') and (a2'). For example, the dissolution rate can be decreased by increasing the content of the constituent unit (a2').

Specifically, the value of the dissolution rate is a value obtained in the following manner.

First, a solution prepared by dissolving the component (A') in an organic solvent is applied on a silicon substrate and the organic solvent is vaporized by a heat treatment to form a resin coating film (thickness: 500 to 1300 nm, for example, 1000 nm). The organic solvent is appropriately selected from conventionally known organic solvents, which are described hereinafter, used in the chemical amplification type positive photoresist composition. The concentration of the component (A') can be adjusted to the same concentration as in the resist composition, for example, 10 to 25% by weight, particularly 20% by weight. After measuring the thickness of the resin coating film, the wafer is immersed in an aqueous 2.38 wt % TMAH solution at 23° C. Then, the time required to completely dissolve the resin film is measured and reduction in film thickness per unit time (nm/second) of the resin coating film is determined therefrom.

The resulting reduction in film thickness of the resin coating film is a dissolution rate of the component (A').

The component (A') may comprise a constituent unit, which is copolymerizable with the constituent units (a1') and (a2'), in addition to the constituent units (a1') and (a2'). The total content of the constituent units (a1') and (a2') is preferably 80 mol % or more, and more preferably 90 mol %, and most preferably 100 mol %. In view of reduction in defects, the component (A') preferably comprises the constituent units (a1') and (a2') in the total content of 100 mol %.

The component (A') can be mixed with one or more kinds of resins having different weight-average molecular weights and resins having different constituent units.

The component (A') can be prepared by conventionally known radical polymerization or living anion polymerization of a monomer from which the units (a1') and (a2') are derived.

The weight-average molecular weight (Mw: value as measured by gel permeation chromatography using polystyrene standards) of the component (A') is preferably from 1500 to 30000, more preferably 2000 to 20000, and most preferably from 3000 to 20000, in view of stability over time and reduction in defects. When the weight-average molecular weight is within the above range, it is made possible to prevent such a disadvantage that the resulting composition becomes insoluble in a solvent and dry etching resistance deteriorates.

The dispersion degree (Mw/Mn: Mn is a number-average molecular weight) of the component (A') is preferably from 1.0 to 5.0, and more preferably 1.0 to 3.0, in view of improvement in resolution and reduction in defects.

(C') Crosslinking Polyvinyl Ether Compound

The component (C') serves as a crosslinking agent for the component (A').

The crosslinking polyvinyl ether compound as the component (C') has the following action. That is, the component (C') functions as follows to the component (A').

When a three-component chemical amplification type positive photoresist composition is applied on a substrate and then prebaked at a temperature within a range from 80 to 150° C., and preferably 120° C. or higher, the crosslinking reaction between the components (C') and (A') is caused by heating to form a resist layer, which is insoluble or slightly soluble in alkali, over the entire surface of the substrate. In the exposure step and the PEB step, crosslinking is decomposed by an action of an acid generated from the component (B'), and thus the exposed area becomes alkali soluble and the unexposed area remains alkali insoluble. Therefore, the exposed area can be removed by alkali development to form a resist pattern.

Therefore, the component (C') is not specifically limited as long as it has such a function.

As the component (C'), for example, a compound having at least two crosslinking vinyl ether groups can be used. Specific examples thereof include ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether and cyclohexane dimethanol divinyl ether. Among these compounds, a crosslinking divinyl ether compound is more preferable.

Also the divinyl ether compound is preferably a compound represented by the following general formula (III'):

in the general formula (III'), $R^4$ is a branched or linear alkylene group having 1 to 10 carbon atoms which may have a substituent, or a substituent represented by the following general formula (IV'). The alkylene group may have an oxygen bond (ether bond) in the main chain.

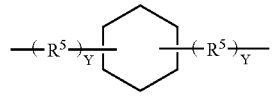

In the general formula (IV'), $R^5$ is also a branched or linear alkylene group having 1 to 10 carbon atoms which may have a substituent, and the alkylene group may have an oxygen bond (ether bond) in the main chain.

Y is 0 or 1.

$R^4$ is preferably —$C_4H_8$—, —$C_2H_4OC_2H_4$—, —$C_2H_4OC_2H_4OC_2H_4$—, or a substituent represented by the general formula (IV'). Among these, a substituent represented by the general formula (IV') is preferable. The compound is preferably a compound wherein $R^5$ has one carbon atom and Y is 1 (cyclohexane dimethanol divinyl ether).

As the component (C'), one or more kinds can be used in combination.

(B') Compound Generating an Acid Under Irradiation with Radiation

In this aspect, the positive photoresist composition may further contain, as the component (B'), conventionally known photo acid generators used in a conventional chemical amplification type photoresist composition. As the photo acid generator, there have hitherto been known various photo acid generators, for example, onium salts such as iodonium salt and sulfonium salt, oxime sulfonates, bisalkyl or bisarylsulfonylazomethanes, poly(bissulfonyl)diazomethanes, diazomethanenitrobenzyl sulfonates, iminosulfonates and disulfones, and therefore, the component (B') is not specifically limited and is selected from these conventionally known photo acid generators.

Specific examples of diazomethane photo acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane and bis(2,4-dimethylphenylsulfonyl)diazomethane.

Specific examples of oxime sulfonate photo acid generators include α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile and α-(methylsulfonyloxyimino)-p-bromophenylacetonitrile. Among these, α-(methylsulfonyloxyimino)-p-methoxyphenylacetonitrile is preferable.

Specific examples of onium salt photo acid generators include trifluoromethane sulfonate or nonafluorobutane sulfonate of diphenyliodonium, trifluoromethane sulfonate or nonafluorobutane sulfonate of bis(4-tert-butylphenyl)iodonium, trifluoromethane sulfonate of triphenylsulfonium, heptafluoropropane sulfonate or nonafluorobutane sulfonate thereof, trifluoromethane sulfonate of tri(4-methylphenyl)sulfonium, heptafluoropropane sulfonate or nonafluorobutane sulfonate thereof, trifluoromethane sulfonate of dimethyl(4-hydroxynaphthyl)sulfonium, heptafluoropropane sulfonate or nonafluorobutane sulfonate thereof, trifluoromethane sulfonate of monophenyldimethylsulfonium, heptafluoropropane sulfonate thereof or nonafluorobutane sulfonate thereof, trifluoromethane sulfonate of diphenylmonomethylsulfonium, and heptafluoropropane sulfonate thereof or nonafluorobutane sulfonate thereof.

Examples of poly(bissulfonyl)diazomethane photo acid generators include 1,3-bis(phenylsulfonyldiazomethylsulfonyl)propane (compound A, decomposition point: 135° C.), 1,4-bis(phenylsulfonyldiazomethylsulfonyl)butane (compound B, decomposition point: 147° C.), 1,6-bis(phenylsulfonyldiazomethylsulfonyl)hexane (compound C, melting point: 132° C., decomposition point: 145° C.), 1,10-bis(phenylsulfonyldiazomethylsulfonyl)decane (compound D, decomposition point: 147° C.), 1,2-bis(cyclohexylsulfonyldiazomethylsulfonyl)ethane (compound E, decomposition point: 149° C.), 1,3-bis(cyclohexylsulfonyldiazomethylsulfonyl)propane (compound F, decomposition point: 153° C.), 1,6-bis(cyclohexylsulfonyldiazomethylsulfonyl)hexane (compound G melting point: 109° C., decomposition point: 122° C.) and 1,10-bis(cyclohexylsulfonyldiazomethylsulfonyl)decane (compound H, decomposition point: 116° C.), each having the following structures.

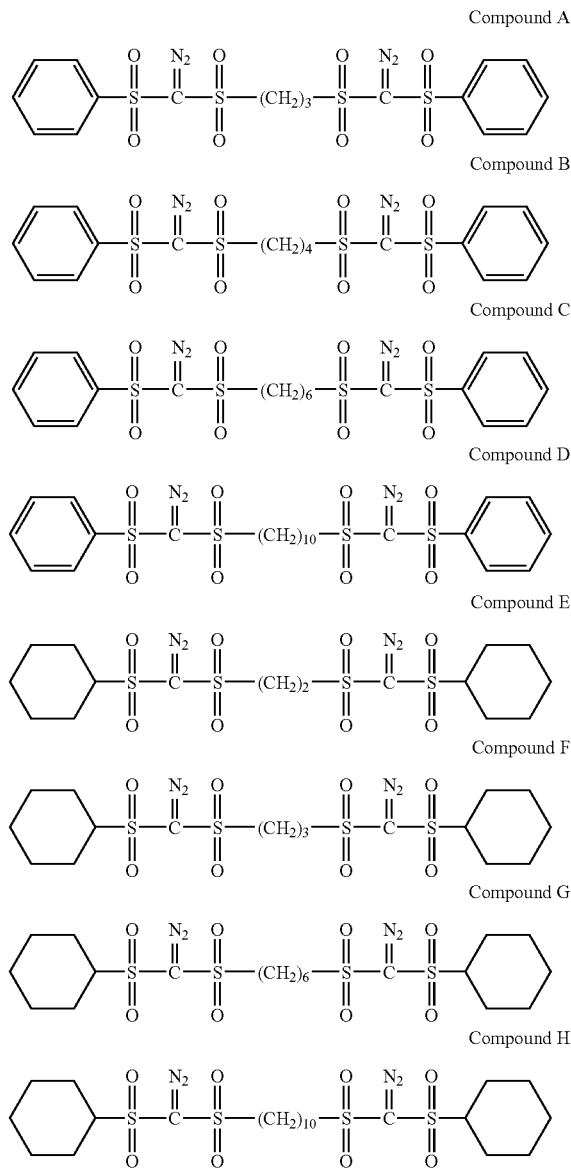

Compound A
Compound B
Compound C
Compound D
Compound E
Compound F
Compound G
Compound H Among these photo acid generators, photo acid generators (compound has a decomposition point of 120° C. or higher, and preferably from 120° C. to 160° C.) are preferable and poly(bissulfonyl)diazomethane photo acid generators are particularly preferable, and a compound G is most preferable.

When the photo acid generator having a decomposition point of 120° C. or higher is used, neither decomposition nor sublimation occurs in the case of prebaking or post exposure baking. When the poly(bissulfonyl)diazomethane photo acid generator is used in combination with the three-component chemical amplification type positive photoresist composition, crosslinking between the components (A') and (C') smoothly proceeds even in the case of high prebaking temperature, preferably.

The content of the component (B') is adjusted within a range from 0.5 to 30 parts by weight, and preferably 1 to 10 parts by weight, based on 100 parts by weight of the component (A'). When the content is less than the above range, sufficient pattern formation may not be conducted. On the other hand, when the content exceeds the above range, a uniform solution may not be obtained and storage stability may deteriorate.

As the component (B'), one or more kinds can be used in combination.

(D') Nitrogen-containing Organic Compound

The positive resist composition of this aspect can further contain, as an optional component, a nitrogen-containing organic compound (D') (hereinafter referred to as a component (D')) so as to improve resist pattern shape and post exposure stability over time.

Since various compounds have already been proposed, the component (D') may be any compound selected from conventionally known compounds and is preferably amine, and particularly preferably secondary lower aliphatic amine or tertiary lower aliphatic amine.

As used herein, the lower aliphatic amine refers to an amine of an alkyl or alkyl alcohol having 5 or fewer carbon atoms. Examples of the secondary and tertiary amines include trimethylamine, diethylamine, triethylamine, di-n-propylamine, tri-n-propylamine, tripentylamine, diethanolamine and triethanolamine. Among these amines, tertiary alkanolamine such as triethanolamine is preferable.

These amines may be used alone or in combination.

The component (D') is commonly used in an amount within a range from 0.01 to 5.0 parts by weight based on 100 parts by weight of the component (A').

Component (E)

The positive photoresist composition of this aspect can further contain, as an optional component, an organic carboxylic acid or oxo acid of phosphorus or derivative (E) thereof (hereinafter referred to as a component (E)) so as to prevent deterioration of sensitivity due to the use in combination with the component (D') and to improve resist pattern shape and post exposure stability. The component (D') can be used in combination with the component (E) and either of them can also be used.

As the organic carboxylic acid, for example, malonic acid, citric acid, malic acid, succinic acid, benzoic acid and salicyclic acid are preferable.

Examples of the oxo acid of phosphorus or derivatives thereof include phosphoric acid or derivatives thereof such as an ester, for example, phosphoric acid, di-n-butyl phosphate or diphenyl phosphate; phosphonic acid or derivatives thereof such as an ester, for example, phosphonic acid, dimethyl ester phosphonate or di-n-butyl phosphonate, phenylphosphonic acid, diphenyl phosphonate or dibenzyl phosphonate; and phosphinic acid or derivative thereof, for example, phosphinic acid or phenyl phosphinic acid. Among these, phosphonic acid is particularly preferable.

The content of the component (E) is from 0.01 to 5.0 parts by weight based on 100 parts by weight of the component (A').

Organic Solvent

The positive resist composition of this aspect can be prepared by dissolving materials in an organic solvent.

The organic solvent is not specifically limited as long as it can dissolve the respective components used to give a uniform solution, and one or more kinds can be appropriately selected from those which are conventionally known as the solvent of a chemical amplification type resist.

Examples thereof include ketones such as γ-butyrolactone, acetone, methyl ethyl ketone, cyclohexanone, methyl isoamyl ketone and 2-heptanone; polyhydric alcohols and their derivatives, such as ethylene glycol, ethylene glycol monoacetate, diethylene glycol, diethylene glycol monoacetate, propylene glycol, propylene glycol monoacetate, dipropylene glycol, and monomethyl ether, monoethyl ether, monopropyl ether, monobutyl ether and monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate and ethyl ethoxypropionate.

These organic solvents may be used alone or in combination.

A solvent mixture of propylene glycol monomethyl ether acetate (PGMEA) and a polar solvent is preferable. The mixing ratio (weight ratio) may be appropriately decided taking account of compatibility of PGMEA with the polar solvent, and is preferably within a range from 1:9 to 8:2, and more preferably from 2:8 to 5:5.

More specifically, the weight ratio of PGMEA to EL is preferably from 2:8 to 5:5, and more preferably from 3:7 to 4:6, in the case of using EL as the polar solvent.

In addition, a solvent mixture of at least one kind selected from PGMEA and EL and γ-butyrolactone is also preferable as the organic solvent. In this case, the mixing ratio of the former to the latter is preferably from 70:30 to 95:5 in terms of a weight ratio.

The amount of the organic solvent is not specifically limited and is appropriately adjusted to allow application on a substrate after preparing a coating solution having a predetermined concentration, according to the thickness of the coating film. The content of the organic solvent is commonly within a range from 2 to 20% by weight, and preferably from 5 to 15% by weight, based on the solid content of the resist composition.

Other Optional Components

If necessary, the positive resist composition of this aspect may further contain additives which are miscible with the positive resist composition, for example, additive resins used for improving performances of the resist film, surfactants used for improving coatability, dissolution inhibitors, plasticizers, stabilizers, colorants and antihalation agents.

Method for Formation of a Resist Pattern

The resist pattern forming method of this aspect can be conducted in the following manner.

First, the above positive resist composition is applied on a substrate such as a silicon wafer using a spinner and is then prebaked (PB) under temperature conditions of, for example, 80° C. or higher, and preferably 120° C. or higher and 150° C. or lower, for 40 to 120 seconds, and preferably 60 to 90 seconds. After selectively exposing to a KrF excimer laser beam via a desired mask pattern using a KrF stepper, PEB (post exposure bake) is conducted under temperature conditions of, for example, 80 to 150° C. for 40 to 120 seconds, and preferably 60 to 90 seconds.

Prebaking is preferably conducted under temperature conditions of, for example, 100° C. or higher, and preferably 120 to 150° C.

Then, development treatment is conducted using an alkali developer solution, for example, an aqueous 0.1-10 wt % TMAH solution. Thus, a resist pattern, which is faithful to the mask pattern, can be obtained.

Between the substrate and the coating layer made of the resist composition, an organic or inorganic antireflective coat can also be provided.

The wavelength of light used for exposure is not specifically limited and the exposure can be conducted using radiation such as an ArF excimer laser, KrF excimer laser, $F_2$ excimer laser, EUV (extreme ultraviolet light), VUV (vacuum ultraviolet light), EB (electron beam), X-ray and soft X-ray. A KrF excimer laser is particularly effective for the chemical amplification type positive photoresist composition of the present invention.

In the chemical amplification type positive photoresist composition and the method for formation of a resist pattern according to the second aspect of the present invention, excellent resolution can be obtained. When using a short-wavelength light source such as a KrF excimer laser, required fine pattern can be resolved. More specifically, in the case a of L&S (line-and-space) pattern, it is made possible to resolve a pattern having a width of about 300 nm or less, preferably. Furthermore, reduction in defects can be realized. Therefore, failure of fine pattern formation can be avoided and it is very advantageous for high integration.

The reason why excellent resolution is obtained is not certain, but one of the factors is believed to be as follows. That is, since the component (A') has a small dissolution rate, a difference in solubility between the unexposed area and the exposed area increases.

One factor for reduction in defects is believed to be as follows. That is, since it is not necessary to protect the component (A') with an acid dissociable dissolution inhibiting group, it is less likely to cause a failure in which a substance involved in defects dissolved in an alkali developer solution is deposited when rinsed with pure water after developing with an alkali developer solution.

Also line edge roughness (LER: unevenness of line side walls) can be suppressed. It is believed that reduction in LER is caused by the same factors as in the case of defects.

In the formation of the resist pattern, since the unexposed area is composed of a coating film containing a base resin having relatively high molecular weight wherein a crosslinked structure is formed of the component (C'), there is also exerted the effect that the resist pattern has excellent heat resistance.

Also the acid component generated from the component (B') exerts an effect capable of raising the limit for PEB conditions because conversion of slight alkali solubility or alkali insolubility into alkali solubility due to the acid component requires relatively small amounts of energy.

EXAMPLES

Examples of First Aspect

Example 1

A resist composition was prepared by mixing a polyhydroxystyrenic resin solution (styrene constituent unit/hydroxystyrene constituent unit=10/90 (mol %), Mw: 2500), 25% by weight of cyclohexane dimethanol divinyl ether as the component (B), 5% by weight of a photo acid generator represented by the formula (VII-A) as the component (C), 0.28% by weight of tri-n-decylamine as the component (D) and 5% by weight of γ-butyrolactone (each amount being based on the solid content of the polyhydroxystyrenic resin), dissolving the mixture in 2-heptanone at a concentration of 35% by weight and filtering the solution.

With respect to the resulting resist composition, the following items were evaluated. The results are shown in Table 1.

Example 2

A resist composition was prepared by mixing a polyhydroxystyrenic resin solution (styrene constituent unit/hydroxystyrene constituent unit=15/85 (mol %), Mw: 4000), 10% by weight of cyclohexane dimethanol divinyl ether as the component (B), 2% by weight of a photo acid generator represented by the formula (VII-A) as the component (C), 0.28% by weight of tri-n-decylamine as the component (D) and 5% by weight of γ-butyrolactone (each amount being based on the solid content of the polyhydroxystyrenic resin), dissolving the mixture in 2-heptanone in the concentration of 35% by weight and filtering the solution.

With respect to the resulting resist composition, the following items were evaluated. The results are shown in Table 1.

(1) Evaluation of Sensitivity

Using a spinner, each sample was applied on a silicon substrate and then heated (prebaked) on a hot plate at 140° C. for 90 seconds to form a resist film having a thickness of 1.5 μm. This film was selectively exposed via a mask (rectile) corresponding to a pattern composed of L&S (line-and-space) width (1:1) each having a width of 1.5 μm using a step-and-repeat system NSR-2205i14E (manufactured by Nikon Corporation, NA (Numerical Aperture)=0.57 (variable)), subjected to a PEB (post exposure bake) treatment at 140° C. for 90 seconds, developed with an aqueous 2.38 wt % TMAH solution at 23° C. for 60 seconds, washed with water for 30 seconds and then dried.

The exposure time required to form a pattern composed of line-and-space width (L&S) (1:1) each having a width of 1.5 μm was represented in millisecond (ms) units (Eop exposure dose).

(2) Evaluation of Undulation Phenomenon

Using critical dimension measurement SEM (trade name "S8840"; manufactured by Hitachi Corporation), a profile of the resulting resist pattern was observed from right over a L&S resist pattern having a width of 1.5 μm. The case in which the undulation phenomenon was not recognized was rated "A", and the case in which the undulation phenomenon was not recognized was rated "B".

(3) Measurement of Depth of Focus (DOF)

Eop exposure dose required to faithfully realize the set size (line width: 1.5 μm, L&S resist pattern: 1:1) of a mask pattern) obtained by the evaluation of sensitivity was employed as a standard exposure dose, and then the cross-sectional SEM micrograph (using SEM (trade name "S4000"; manufactured by Hitachi Corporation) of a profile of L&S (line width: 1.5 μm, L&S resist pattern: 1:1) taken in the exposure dose under the conditions of the focal point moving upward and downward, followed by exposure and further development was observed. A maximum value (μm) of focal point deviation required to obtain a rectangular resist pattern having a width of 1.5 μm within the set size of ±10% in the SEM micrograph was taken as depth of focus.

(4) Heat Resistance Test

In the same manner as described above, a L&S resist pattern having a width of 1.5 μm was formed in the exposure dose (Eop) obtained by the above sensitivity test and subjected to a heat treatment at 140° C. for 300 seconds. Then, a cross-sectional profile was observed by SEM (trade name "S4000"; manufactured by Hitachi Corporation). The case in which deformation of the resist pattern was scarcely observed was rated "A", and the case where shrinkage of the resist pattern was observed was rated "B".

(5) Evaluation of Resolution

Resolution was represented by threshold resolution in the above Eop exposure dose.

Comparative Example 1

A novolak-naphthoquinone positive photoresist composition for i-rays "THMR-iP5800 BE" (trade name: manufactured by Tokyo Ohka Kogyo Co., Ltd.) was evaluated in the same manner as in Example 1.

Comparative Example 2

In the same manner as in Example 1, except that polyhydroxystyrene homopolymer (weight-average molecular weight: 2500) was used as the component (A), a resist composition was prepared and evaluated.

Comparative Example 3

In the same manner as in Example 1, except that a novolak resin (weight-average molecular weight: 5000, dispersion degree (Mw/Mn): 10) was used as the component (A), a resist composition was prepared and evaluated. Mn is the number-average molecular weight.

Novolak resin obtained by the condensation polymerization reaction of a phenol mixture of m-cresol/p-cresol=40/60 (molar ratio) and an aldehyde mixture of formaldehyde/salicylaldehyde=1/0.3 (molar ratio) using a conventional method.

TABLE 1

| | Evaluation of undulation phenomenon | Sensitivity (ms) | DOF (μm) | Heat resistance | Resolution (μm) |
|---|---|---|---|---|---|
| Example 1 | A | 300 | >4.8 | A | 0.6 |
| Example 2 | A | 260 | >4.8 | A | 0.6 |
| Comparative Example 1 | A | 320 | 4.5 | B | 0.6 |
| Comparative Example 2 | B | 300 | >4.8 | A | 0.7 |
| Comparative Example 3 | A | 300 | 4.2 | A | 0.6 |

In the Examples of this aspect, undulation phenomenon was suppressed, and thus the resulting composition had high sensitivity, high heat resistance, high resolution, and excellent depth of focus.

Examples of Second Aspect

Example 3

The following materials were dissolved in the following organic solvent to prepare a chemical amplification type positive photoresist composition.

Component (A'): 100 parts by weight
(Constituent unit (a1') in the component (A'): hydroxystyrene unit of the general formula (I') wherein R is a hydrogen atom, l=1 and a hydroxyl group is linked at the p-position
Constituent unit (a1') in the component (A'): 80 mol %

Constituent unit (a2') in the component (A'): styrene unit of the general formula (II') wherein R=hydrogen atom, n=0, constituent unit (a2') of the component (A'): 20 mol %
Dissolution rate of the component (A'): 24 nm/second
Weight-average molecular weight of the component (A'): 10000, dispersion degree=1.8)
Component (B'): photo acid generator represented by the compound (G): 5 parts by weight
Component (C'): cyclohexane dimethanol divinyl ether: 20 parts by weight
Nitrogen-containing organic compound (D'): triethanolamine: 0.1 parts by weight
Organic solvent: PGMEA/EL=6/4 (weight ratio): 630 parts by weight Comparative Example 4

Resin component: 100 parts by weight
(Mixture of 75 parts by weight of a resin obtained by protecting 39 mol % of hydroxyl groups of a hydroxystyrenic resin (weight-average molecular weight: 12000, dispersion degree=2.2) comprising only a constituent unit (a1') of the general formula (I') wherein R=hydrogen atom, l=1 and hydroxyl group is linked at the p-position, with a 1-ethoxyethyl group, and 25 parts by weight of a resin obtained by protecting 35 mol % of hydroxyl groups of a hydroxystyrenic resin (weight-average molecular weight: 12000, dispersion degree=2.2) comprising only a constituent unit (a1') of the general formula (I') wherein R=hydrogen atom, l=1 and a hydroxyl group is linked at the o-position, with a t-boc group,
Dissolution rate: 0.5 nm/second)
Component (B') (bis(cyclohexylsulfonyl)diazomethane): 5.0 parts by weight
Component (D'): the same as in Example 3
Organic solvent (PGMEA): 600 parts by weight Comparative Example 5

Component (A'): hydroxystyrenic resin (resin comprising only a constituent unit (a1') of the general formula (I') wherein R=hydrogen atom, l=1 and a hydroxyl group is linked at the p-position) (molecular weight: 12000, dispersion degree: 2.2): 100 parts by weight
Dissolution rate: 500 nm/second or more
Component (B'): the same as in Comparative Example 4
Component (C'): cyclohexane dimethanol divinyl ether: 20 parts by weight
Component (D'): the same as in Comparative Example 4
Organic solvent PGMEA/EL=6/4 (weight ratio): 630 parts by weight Evaluation Procedure With respect to the chemical amplification type positive photoresist compositions obtained in Example 3 and Comparative Examples 4 and 5, the following evaluations (1) to (2) were conducted.

(1) Evaluation of Resolution

Each resist composition was applied on an 8-inch silicon substrate whose surface was treated with hexamethyldisilazane (HMDS) using a spinner and then dried on a hot plate by prebaking under the conditions at 130° C. for 60 seconds (Example 3), at 100° C. for 60 seconds (Comparative Example 4) or at 130° C. for 60 seconds (Comparative Example 5) to obtain resist films having a thickness of 420 nm.

Using a KrF step-and-repeat system (trade name: "NSR-S203B", manufactured by Nikon Corporation, NA=0.60, σ=0.65), the resist film was selectively irradiated (selective exposure) with KrF excimer laser (248 nm) via a mask (binary), subjected to a PEB treatment under conditions of 130° C. for 60 seconds (Example 3), at 110° C. for 60 seconds (Comparative Example 4) or at 130° C. for 60 seconds (Comparative Example 5), puddle-developed with an aqueous 2.38 wt % tetramethylammonium hydroxide solution at 23° C. for 60 seconds and then rinsed with pure water for 10 seconds. After subjecting to shake-off drying and drying, a L&S (line-and-space) pattern was formed.

Then, the exposure dose ($EOP_{300}$, unit: $mJ/cm^2$) at which a L&S resist pattern having a line width 300 nm and a pitch of 600 nm can be faithfully reproduced was determined.

Selective exposure was conducted at the above $EOP_{300}$ and the formed pattern was observed by a scanning electron microscope.

As a result, a L&S pattern of 190 nm (pitch: 380 nm) could be resolved at 33 $mJ/cm^2$ in Example 3, while only a L&S pattern of 220 nm (pitch: 440 nm) could be resolved at 28 mJ/cm2 in Comparative Example 4. The entire resist film was dissolved during the development in Comparative Example 5.

(2) Evaluation of Defects

With respect to the resist pattern formed in the above evaluation (1), defects were measured by a surface defect detection equipment KLA2132 (trade name) manufactured by KLA-TENCOR CORPORATION and then the number of defects in the substrate was evaluated.

As a result, the number of defects per substrate was 5 in Example 3, and 260 in Comparative Example 4. In Comparative Example 5, evaluation could not be conducted because the entire resist film was dissolved.

It could be confirmed from the evaluation results of Example 3 and Comparative Examples 4 and 5 that the chemical amplification type positive photoresist composition of the second aspect of the present invention exerts the effect of improving resolution and reducing defects.

INDUSTRIAL APPLICABILITY

The chemical amplification type positive photoresist composition and the resist pattern forming method of the present invention are suited for use in the fields of the production of semiconductors and liquid crystal devices.

What is claimed is:

1. A chemical amplification type positive photoresist composition comprising:
(A) an alkali soluble resin consisting of 70 to 99 mol % of a constituent unit (a1) represented by the following general formula (I):

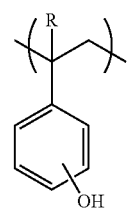

(I)

wherein R represents a hydrogen atom or a methyl group, and 1 to 30 mol % of a constituent unit (a2) represented by the following general formula (II):

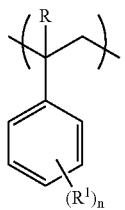

(II)

wherein R represents a hydrogen atom or a methyl group, $R^1$ represents an alkyl group having 1 to 5 carbon atoms and n represents an integer of 0 or 1 to 3, the total of said constituent units (a1) and (a2) being 100 mol %;

(B) a compound represented by the following general formula (III):

$$H_2C=CH-O-R^2-O-CH=CH_2 \quad (III)$$

wherein $R^2$ represents either an alkylene group having 1 to 10 carbon atoms which may have a substituent, or a group represented by the following general formula (IV):

(IV)

(wherein $R^3$ represents an alkylene group having 1 to 10 carbon atoms which may have a substituent, and m represents 0 or 1), and the alkylene group may have an oxygen bond (ether bond) in the main chain; and (C) a compound generating an acid component under irradiation with radiation; and an organic solvent.

2. The chemical amplification type positive photoresist composition according to claim 1, wherein the component (A) comprises the constituent unit (a1) and the constituent unit (a2).

3. The chemical amplification type positive photoresist composition according to claim 2, wherein the content of the constituent unit (a2) in the component (A) is from 1 to 20 mol %.

4. The chemical amplification type positive photoresist composition according to claim 1, wherein the component (C) is a compound generating an acid component under irradiation with i-rays (365 nm).

5. The chemical amplification type positive photoresist composition according to claim 1, which further comprises a basic compound (D) in the amount of 0.01 to 5 parts by weight based on 100 parts by weight of the component (A).

6. A method for formation of a resist pattern, which comprises the steps of applying the positive photoresist composition of claim 1 on a substrate and subjecting to a heat treatment to form a resist layer having a film thickness of 1.5 to 7.0 µm; performing selective exposure; performing PEB (post exposure bake); and performing a development treatment with an aqueous alkali solution to form a resist pattern.

7. A chemical amplification type positive photoresist composition comprising (A') an alkali soluble resin, (B') a photo acid generator generating an acid under irradiation with radiation, and (C') a crosslinking polyvinyl ether compound, wherein the component (A') consists of 70 to 90 mol % of a unit (a1') derived from (α-methyl)hydroxystyrene represented by the following general formula (I'):

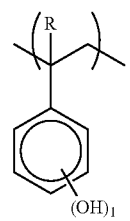

(I')

wherein R represents a hydrogen atom or a methyl group and l represents an integer of 1 to 3, and 10 to 30 mol % of an alkali-insoluble unit (a2') having no acid dissociable dissolution inhibiting group, and wherein a dissolution rate to an aqueous 2.38 wt % TMAH (tetramethylammonium hydroxide) solution of the component (A') is from 10 to 100 nm/second, the total of said constituent unit (a1') and (a2') being 100 mol %.

8. The chemical amplification type positive photoresist composition according to claim 7, wherein the constituent unit (a2') is a unit derived from (α-methyl)styrene represented by the following general formula (II'):

(II')

wherein R represents a hydrogen atom or a methyl group, $R^{11}$ represents an alkyl group having 1 to 5 carbon atoms and n represents an integer of 0 or 1 to 3.

9. The chemical amplification type positive photoresist composition according to claim 7, wherein the weight-average molecular weight of the component (A') is from 1500 to 30000.

10. The chemical amplification type positive photoresist composition according to claim 7, wherein the component (B') is a photo acid generator having a decomposition point of 120° C. or higher.

11. The chemical amplification type positive photoresist composition according to claim 10, wherein the component (B') is a poly(bissulfonyl)diazomethane photo acid generator.

12. The chemical amplification type positive photoresist composition according to claim 7, which further comprises a nitrogen-containing organic compound (D).

13. A method for formation of a resist pattern, which comprises the steps of applying the positive photoresist composition of claim 7 on a substrate and subjecting to prebaking; performing selective exposure; performing PEB (post exposure bake); and performing a development treatment with an aqueous alkali solution to form a resist pattern.

* * * * *